United States Patent
Taylor et al.

(10) Patent No.: US 7,429,860 B2
(45) Date of Patent: Sep. 30, 2008

(54) NOISE REDUCTION FOR SPECTROSCOPIC SIGNAL PROCESSING

(75) Inventors: Howard S. Taylor, Los Angeles, CA (US); Sharif Kunikeev, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 78 days.

(21) Appl. No.: 10/766,599

(22) Filed: Jan. 27, 2004

(65) Prior Publication Data

US 2004/0239323 A1  Dec. 2, 2004

Related U.S. Application Data

(60) Provisional application No. 60/445,671, filed on Feb. 7, 2003, provisional application No. 60/443,086, filed on Jan. 28, 2003.

(51) Int. Cl.
G01V 3/00 (2006.01)
(52) U.S. Cl. .................. 324/307; 324/312; 324/311; 700/94
(58) Field of Classification Search .......... 700/94; 324/307, 311, 312
See application file for complete search history.

(56) References Cited

U.S. PATENT DOCUMENTS

| | | | | |
|---|---|---|---|---|
| 3,717,809 | A | * | 2/1973 | Laukien ............... 324/310 |
| 3,753,081 | A | * | 8/1973 | Freeman ............... 324/311 |
| 5,041,789 | A | * | 8/1991 | Keller et al. ............ 324/318 |
| 5,148,379 | A | * | 9/1992 | Konno et al. ............ 716/20 |
| 5,148,522 | A | * | 9/1992 | Okazaki ............... 345/855 |
| 5,420,508 | A | * | 5/1995 | Smith ................. 324/307 |
| 5,453,940 | A | * | 9/1995 | Broomhead et al. ..... 702/109 |
| 5,485,086 | A | * | 1/1996 | Meyer et al. ........... 324/307 |
| 5,490,516 | A | * | 2/1996 | Hutson ................ 600/508 |
| 5,910,728 | A | | 6/1999 | Sodickson |
| 6,002,480 | A | * | 12/1999 | Izatt et al. ............ 356/479 |
| 6,046,591 | A | | 4/2000 | King et al. |
| 6,147,491 | A | | 11/2000 | Shen |
| 6,181,135 | B1 | | 1/2001 | Shen |

(Continued)

OTHER PUBLICATIONS

Worley et al., "Application of DSP Techniques to Nuclear Magnetic Resonance Spectroscopy", Nuclear Science Symposium and Medical Imaging Conference, 1991., Conference Record of the 1991 IEEE, vol. 3, Nov. 2-9, 1991, pp. 2129-2132.*

(Continued)

*Primary Examiner*—Brij B. Shrivastav
*Assistant Examiner*—Megann E Vaughn
(74) *Attorney, Agent, or Firm*—McDermott Will & Emery LLP

(57) ABSTRACT

A windowed noise reduction technique is presented that allows a noise-reduced spectrum of satisfactory accuracy to be recovered from original noisy spectroscopic data, while acquiring a significantly reduced number of transient acquisitions. The signal-averaged, decimated signal is written as a sum of a noisefree component and a noise component, and a vector space that contains a noisefree subspace and a noise subspace is created using these decimated signals. A correlation matrix is constructed in this vector space, and diagonalized to yield the singular values. The appearance of a clear gap between the noisefree singular values and the noise singular values, in a singular value graph, and the stability of the gap, supplies the criteria for determining that a sufficient number of iterations has been performed.

20 Claims, 5 Drawing Sheets

U.S. PATENT DOCUMENTS

| | | |
|---|---|---|
| 6,339,626 B1 | 1/2002 | Bernstein et al. |
| 6,377,045 B1 | 4/2002 | Van Den Brink et al. |
| 6,388,443 B1 | 5/2002 | Gembris et al. |
| 6,476,606 B2 | 11/2002 | Lee |
| 6,556,009 B2 | 4/2003 | Kellman et al. |
| 6,564,082 B2 | 5/2003 | Zhu et al. |
| 6,573,714 B1 | 6/2003 | Hu et al. |
| 6,621,433 B1 | 9/2003 | Hertz |
| 6,633,162 B2 | 10/2003 | Zhang et al. |
| 2001/0054898 A1 | 12/2001 | Li et al. |
| 2002/0060567 A1 | 5/2002 | Harvey et al. |
| 2002/0158632 A1 | 10/2002 | Sodickson |
| 2003/0004408 A1 | 1/2003 | Zhu |
| 2004/0054479 A1* | 3/2004 | Trickett .................. 702/14 |

OTHER PUBLICATIONS

Haimovich et al., "An Eigenanalysis Interference Canceler", IEEE Transactions on Signal Processing, vol. 39, No. 1, Jan. 1991, pp. 76-84.*

Manolakis, Dimitris G., Ingle, Vinjay K., and Kogon, Stephen M., "Statistical and Adaptive Signal Processing", 2000, McGraw-Hill, pp. 125-133.*

Gonzalez, Rafael C. and Woods, Richard E., "Digital Image Processing", 2002, Prentice Hall, 2nd Edition, pp. 677-679.*

Haimovich, A.M. et al. An Eigenanalysis Interference Canceler, IEEE Transactions on Signal Processing, vol. 39, No. 1, Jan. 1991: pp. 76-84.

Worley, J. et al. Application of DSP Techniques to Nuclear Magnetic Resonance Spectroscopy.

* cited by examiner

NOISE REDUCTION FOR SPECTROSCOPIC SIGNAL PROCESSING

CROSS-REFERENCE TO RELATED APPLICATIONS

This application claims priority to U.S. provisional application, Ser. No. 60/443,086, filed on Jan. 28, 2003, entitled "Producing Windowed Noise Reduced Signals for Fourier and High Resolution Signal Processing for Spectroscopies such as NMR, ICR, etc.," and U.S. provisional application, Ser. No. 60/445,671, filed on Feb. 7, 2003, entitled "Producing Windowed Noise Reduced Signals for Fourier and High Resolution Signal Processing for Spectroscopies such as NMR, ICR, etc." The entire content of both applications is incorporated herein by reference.

GOVERNMENT'S INTEREST IN APPLICATION

This invention was made with government support under Grant No. PHY-0071742, awarded by the National Science Foundation of the United States Government. The government has certain rights in the invention.

BACKGROUND OF THE INVENTION

1. Field of Invention

The present invention relates to signal processing in Nuclear Magnetic Resonance (NMR) and other spectroscopic techniques.

2. Background

In NMR spectroscopy, as well as in other spectroscopic methods, noise reduction can be a serious problem. In most experimental NMR studies, excessive noise can be present in the measured time domain signal, which decays exponentially and is thus called an FID ("free induction decay") signal. Because of the noise, the Fourier transformed spectrum may not allow the underlying spectrum to be reliably differentiated or extracted from the noise.

A number of methods are known in the art for reducing noise in NMR studies. Signal averaging over many transients or scans is widely known. In signal averaging, however, the signal grows relatively slowly over time. Also, other factors such as sample concentration, magnetic field strength, and NMR machine design frequently affect the intensity of the NMR signal, which is inherently rather weak. Because of these factors, the needed number of transients may often be very high. When the fast Fourier transform method is used to derive the spectrum from the measured data, the requisite number of transients may be too high for certain experiments to be practically feasible.

Many attempts have been made to address this problem by developing data processing methods that can extract signal information from noisy data using available knowledge regarding the model for the underlying signal. One known method is harmonic inversion, which is a parameter fitting model that extracts the desired spectral parameters by fitting the data to a sum of damped harmonics. The knowledge used here is that a linear combination of complex decaying exponentials can be assumed to be a good model for an NMR FID signal. The equations that relate the measured FID signal to such a model directly yield, when solved, spectral parameters such as the position, width, and intensity of each nuclear resonance, so that a spectrum can be reconstructed from these parameters.

The harmonic inversion method achieves a higher spectral resolution, for a given signal length, compared to the Fourier transform method. The solutions to the harmonic inversion equations, however, can be extremely sensitive to small noise perturbations. Various regularization techniques have been proposed. With no noise or with very little noise, the harmonic inversion method usually provides acceptable results when used with these regularization schemes. At typical noise levels, however, the harmonic inversion method together with the regularization schemes may yield inconsistent and unreliable results, producing spectra with false or missing spectral lines.

For these reasons, there is a need for a method and system that allows reliable spectra to be derived from spectroscopic data, without requiring an excessive number of transient acquisitions.

SUMMARY

A method and system is presented that is based on harmonic inversion, and that allows for a reliable spectrum to be obtained using a greatly reduced number of transients or signal measurements. By providing criteria for recognizing when to stop transient collection, the machine time that is required in order to measure a spectrum to a requisite degree of accuracy, and to implement harmonic inversion reliably, can be significantly reduced.

In one embodiment, the NMR response signal from a sample is measured, and the measured signal is averaged over a number of measurements. The averaged signal is written as a sum of a noisefree component and a noise component, and is used to create a vector space that has a noisefree subspace and a noise subspace. A correlation matrix is created within the vector space. The correlation matrix is diagonalized, to yield the singular values and their corresponding eigenvectors. The singular values, which include noisefree singular values associated with the noisefree subspace, and noise singular values associated with the noise subspace, are plotted in a graph.

The appearance and subsequent stabilization of a clear gap between a noisefree singular value and a noise singular value are criteria that establish that a sufficient number of transients have been acquired. When the gap stabilizes, the measured signal is projected onto the noisefree subspace to produce a noise-reduced signal, which is then frequency converted by harmonic inversion or by other signal processing methods (such as Fourier transform), to generate a noise-reduced spectrum.

Instead of monitoring the signal-to-ratio of the spectrum as more measurements are made and averaged over, as done in other methods known in the art, in the present method and system, the criterion for stopping the acquisition of transients is the appearance of a stable gap in the singular value graph, and the appearance of a stable spectrum thereafter.

The method and system described above reduces the number of transients required to obtain satisfactory NMR spectra by a factor of about 10 to about 100, compared to a method in which signal averaging is performed using Fourier transforms only.

DETAILED DESCRIPTION

A method and system is presented that links the termination of transient acquisitions to the appearance of a gap in a singular value plot made from previously measured data, rather than to the signal-to-noise ratio of the resulting spectrum.

Figure 1:
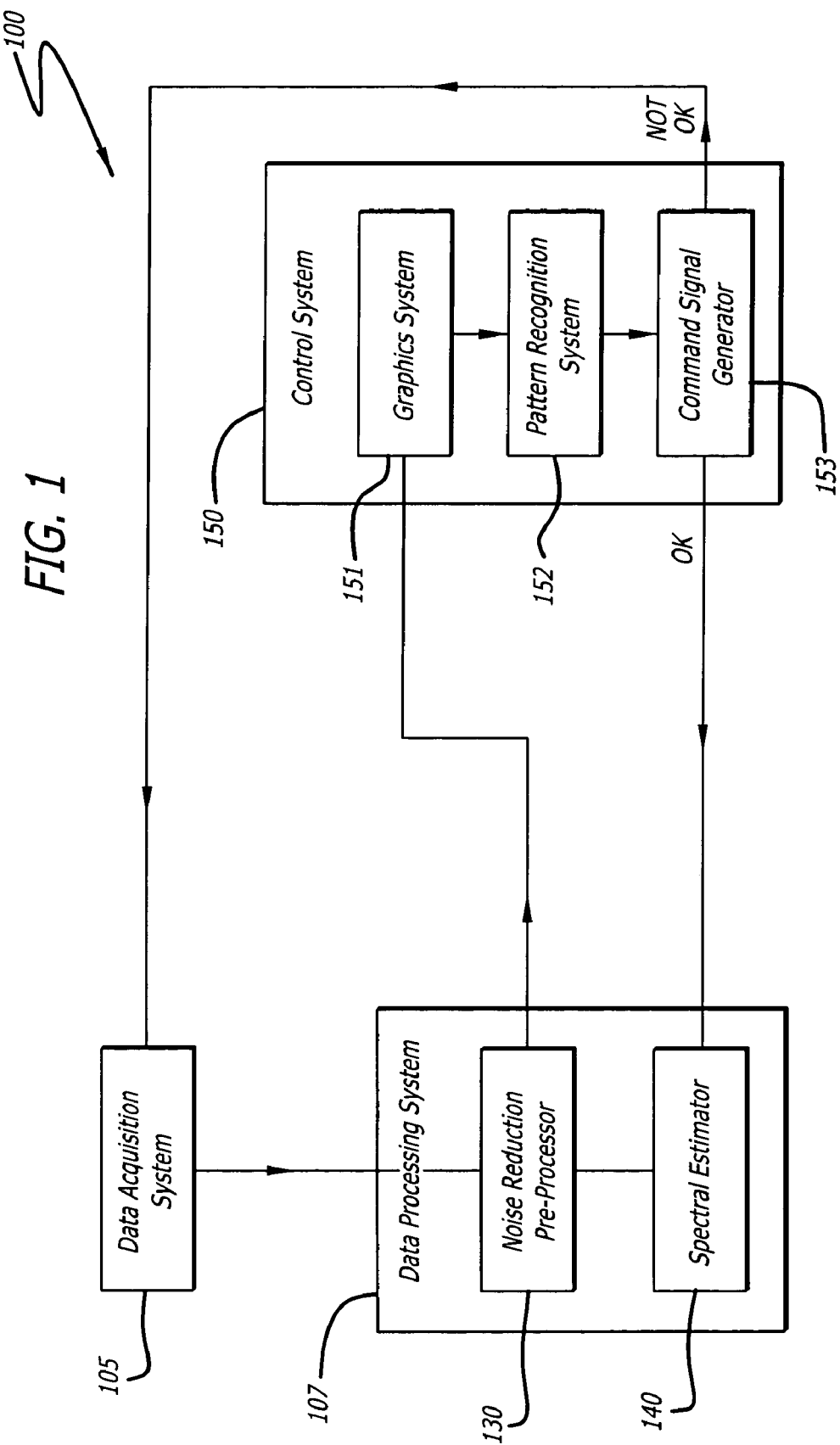
FIG. 1 is a schematic block diagram of an apparatus for performing spectral analysis, in accordance with one embodiment.

FIG. 1 is a schematic block diagram of an apparatus 100 for performing spectral analysis of a sample, in accordance with one embodiment. The apparatus 100 generates the characteristic spectra of one or more constituents of the sample, by applying an excitation energy to the sample, measuring the signals emitted by the sample in response to the applied excitation energy, and processing the signals to generate the desired spectrum. Usually, the excitation energy takes the form of a sequence of RF excitation pulses, although in some spectroscopic techniques such as continuous wave NMR spectroscopy, a continuous wave of excitation energy may be applied. In one embodiment, the apparatus 100 is an NMR apparatus for performing NMR spectroscopy. While an NMR apparatus will be described in this section, it should be noted that the system and method of the present invention is not limited to NMR spectroscopy, and can also be used in conjunction with spectroscopic techniques, other than NMR, which use signal averaging to reduce noise.

In overview, the NMR apparatus 100 includes a data acquisition system 105 that measures the response signals emitted by the sample in response to the RF excitation pulses that have been applied thereto, and a data processing system 107 that processes the measured signals to generate the desired characteristic spectra for the constituents of the sample. The signal averaging method, well known in the art, is used. The signals are averaged over a large number of measurements or scans (called "transients" in NMR spectroscopy) in order to lower the noise content compared to a single signal measurement or transient. The apparatus 100 further includes a control system 150 that controls the activation of the data acquisition and processing systems 105 and 107. The control system 150 determines the number of measurements that should be made in order to generate a spectrum having desired noise characteristics, as described below.

The data acquisition system 105, which acquires the NMR response signals, includes components well known in the art. For example, the data acquisition system may include a measurement subsystem for measuring NMR response signals, and a signal averaging subsystem for averaging the measured signals over many measurements to lower the noise content in the signals. In signal averaging, the signal grows relative to noise by a factor $\sqrt{N_{tr}}$, where $N_{tr}$ represents the number of measured transients. The measurement subsystem typically includes an NMR transmitter for generating RF excitation pulses and delivering the pulses onto an NMR sample, and an NMR receiver for detecting the response signals emitted by the sample in response to such an excitation. NMR transmitters and receivers are well known in the art and commercially available. The signal averaging subsystem is also a standard component in NMR signal processing, and includes processing subsystems for receiving and storing an acquired transient after each measurement, and for averaging over all of the acquired and stored transients.

The signal averaging subsystem averages the corresponding sample points over all the transients. In this way, an averaged signal (sometimes called "ensemble averaged signal" in the art) is generated in which signal-to-noise correlations are very small, and which have a lower noise content than any single signal measurement or transient. The averaged signal may be represented as a discretized set of N sampled data points $c_n$ (n=0, ..., N−1).

In one embodiment, the data processing system 107 implements a signal processing scheme which is based on harmonic inversion, and which allows for spectra of satisfactory quality to be obtained while averaging over a greatly reduced number of transients. By "satisfactory" quality, it is meant that the error margin is within the standards accepted in the industry, and that there are no false or missing spectral lines. In overview, the data processing system 107 includes a noise reduction preprocessor 130 for transforming the averaged signal into a noise-reduced signal, and a spectral estimator 140 for converting the noise-reduced signal into a frequency domain to generate the desired spectrum. Preferably, the data processing system 107 also includes a windowing capability which breaks the Fourier transformed signal into "windows," i.e. into regions of smaller bandwidth.

A windowing program in the data processing system 107 applies a windowing filter to the averaged signal that is outputted by the data acquisition system 105. In one embodiment, the averaged signal is fast Fourier transformed, and the fast Fourier transformed frequency domain signal is broken into windows of 200 to 500 Fourier grid points. The window size that is most commonly used is about 300 Fourier grid points. While the method and system of the present invention can be implemented without the windowing step, windowing provides many advantages for the noise reduction portion of the signal processing described in this section. Without windowing, the singular value graphs (discussed below) become too cluttered with signal and noise singular value points to be easily analyzed. Also, because certain windows are much simpler to process than others, if the windowing step is omitted all features become unnecessarily tied to the features most affected by noise. Finally, without windowing the dimensions of a matrix that must be generated and diagonalized in order to solve the harmonic inversion equations may become too large, and as a consequence the needed diagonalization routine may become too time consuming.

When harmonic inversion is used, windowing creates a smaller signal of length $N_d$ which is much smaller than N, and which is valid only within the window. Resolution is not affected by this signal length reduction. The length $N_d$ of the smaller signal determines, in turn, the dimensions of the systems of equations to be solved in harmonic inversion, the dimensions being given by $N_d/2$. Since these equations have a rank less than their dimension $N_d/2$, they are ill-conditioned and unstable, and the results are very sensitive to small perturbations.

The edges of the windows are at the Fourier grid points. Ideally, their placement would surround the regions of the signal, and begin and end in regions of pure noise. In less than ideal situations a systematic windowing of the spectrum can be designed for all regions. If, because of spectral density reasons, peaks unavoidably appear at window edges where window induced distortions will occur, an additional window should be chosen so that the edge of the prior window falls interior to the new window.

The windowing filter is a "decimation" window, which when applied to the averaged signal $c_n$ (n=0, ..., N−1) produces a decimated, band-limited signal of length $N_d$ from the measured averaged signal $c_n$ of length N. The decimated signal will be referred to in this section as $c_n^d$ (n=0, ..., $N_d$−1). The signal length $N_d$ of the decimated signal is substantially less than the signal length N of the measured averaged signal. The decimated signal $c_n^d$ is inputted into the noise reduction preprocessor described below. In a typical Fourier spectrum of a signal made of a given number of transients, all intensities outside the window of $N_d$ Fourier grid points are set to zero. The window spectrum is then shifted symmetrically about zero frequency and inverse Fourier transformed, to produce a decimated time signal. The original bandwidth, given by $2\pi/\tau$ where $\tau$ is the sampling period, is now reduced by a factor of $N_d/N$. The effective sampling period of the decimated signal is given by $N_{96}/N_d = \tau_d$, which is substantially greater than the original sampling period $\tau$.

The noise reduction pre-processor 130 takes the decimated signal and creates a low noise signal therefrom. In one embodiment, the noise reduction pre-processor 130 includes: 1) a matrix generator that constructs a correlation matrix from the decimated signal, 2) a matrix diagonalizer that diagonalizes the correlation matrix to extract the singular values (i.e. the real, non-negative eigenvalues) and the corresponding eigenvectors, and 3) a signal projector that projects the decimated signal onto the noisefree subspace to generate noise-reduced signals.

In one embodiment, the matrix generator generates the correlation matrix within an M-dimensional vector space defined by the decimated signals $c_n^d$ (n=0, ..., $N_d$−1). Specifically, from the $N_d$ decimated time signal samples $c_n^d$, a number $N_d$−M+1 of linearly independent, M-dimensional measured signal vectors $\vec{c} = (c_n, c_{n+1}, ..., c_{n+M-1})$ are created, to define an M-dimensional vector space. The measured signal vectors are then written as a sum of a noiseless signal vector $\vec{x}_n$ and a random noise vector $\vec{\epsilon}_n$. In this way, the vector space defined by these M-dimensional measured signal vectors includes a noisefree signal subspace, and a random noise subspace.

It is known that the noisefree NMR, EPR etc. FID signal of chemical samples are made of K complex harmonics. A basic assumption of the harmonic inversion method is that the noiseless signal elements $x_n$ are created from a sum of K damped harmonics, i.e. that the spectrum is the sum of K complex Lorentzians. K is the rank of the observed spectral peaks. In harmonic inversion, the noisefree signal vectors are written as a finite sum of damped harmonics. The noise vectors cannot be similarly fitted.

Specifically, the noiseless signal vectors are written vectorially, and sample by sample, as:

$$\vec{x}_n = \sum_{k=1}^{K} d_k z_k^n \vec{s}_k \text{ and } x_n = \sum_{k=1}^{K} d_k z_k^n \tag{2}$$

where $(\vec{S}_k)^T = (1, z_k, ..., z_k^{M-1})$, $z = \exp(-i\omega_k \tau_d)$.

In equation (2) above, $d_k$ represents the weight of the K-th harmonic, and $\omega_k$ represents the complex frequency of the k-th harmonic.

In equation (2), $Z_k$ is a damped exponential in the time domain. The real part of $\omega_k$ is the frequency and the modulus of the imaginary part |Im ($\omega_k$)| is twice the width of the Lorentzian of height $d_k$I|Im ($\omega_k$)|. The rank or dimension of the signal space K is not an input, and is determined by the processing. Since the vectors $\vec{s}_k$ are linearly independent, they form a basis set for a signal space in which the signal vectors $\vec{x}_n$ must lie.

From the decimated signal $c_n^d$, the matrix generator constructs a M-by-M Hermitian covariant correlation matrix $R_{ij}$ (i=1, ..., M; j=1, ... M) in accordance with the following formula:

$$R_{ij} = \frac{1}{N_d - M + 1} \sum_{n=0}^{N_d - M} c_{n+i-1} c^*_{n+j-1} \tag{3}$$

Using a standard diagonalization routine, the matrix diagonalizer diagonalizes the correlation matrix R, thereby obtaining the singular values $u_i$ and their corresponding eigenvectors $\vec{u}_i$, i=1, ..., M. The singular values are the real, non-negative eigenvalues of the correlation matrix. The singular values are indexed so that $u_i > u_{i+1}$. After a sufficient number of transients, the signal projector projects the measured vectors onto the noisefree signal subspace, the projections representing the noise-reduced signal vectors.

The singular values can be divided between noisefree singular values, associated with the noisefree signal subspace, and the noise singular values associated with the noise signal subspace. In order to determine whether a sufficient number of transient acquisitions have been made, for purposes of obtaining a noise-reduced spectrum, a graph of ln ($u_i$) against the index i is produced.

The user or operator of the apparatus 100 determines whether a separation or a "gap" between the first noise point (i.e. noise singular value) in the plot, and the smallest signal point (i.e. noisefree singular value) in the plot, can be identified. This provides a first criterion for recognizing that the iterations performed so far may be close to being sufficient for purposes of producing an acceptable spectrum. The user or operator then determines whether the gap stabilizes over a number of additional measurements, signal-averaging, and singular value generation, described above. This provides a second criterion for recognizing that a sufficient number of transients has been acquired. As a supplemental criterion, the operator may also determine whether the spectrum also stabilizes over a number of additional measurements.

In the method and system described in this section, the interactivity is with the singular value graph, not with the signal-to-ratio ratio that is monitored as the transients are being acquired, in contrast to known methods, such as the FFT (fast Fourier transform) method. When the FFT method is used, transients are taken and signal averaging is performed, until the desired signal-to-noise ratio is achieved. In practice, the operator watches the noise decrease, and watches the signal "rise out" of the background. This is not done here. Instead, the criterion for stopping the acquisition of transients is the appearance of a stable gap in the singular value graph, and, supplementally, the appearance of a stable spectrum.

As an alternative to user interaction with the singular value graph, the control system 150 can be configured to determine whether the criteria described in paragraph 35 have been satisfied. For specific types of spectroscopy, spectrometers, active nuclei concentration, and physical parameters, calibrations can be made as to when the gap will appear. These calibrations do away with the need for user interactivity, in which case the control system 150 can be configured to determine: 1) whether a clearly discernable gap has appeared between the smallest signal point and the first noise point in the plot of singular values; and 2) whether the gap has stabilized with respect to further acquisition of transients by the data acquisition system 105. In this embodiment, once the control system 150 determines that such a gap has appeared and stabilized, the control system 150 sends command signals to stop the data acquisition system 105 from making further measurements.

The appearance of the gap and the stabilization of the gap establish that a sufficient number of transients have been performed for noise reduction to be implemented, for K to be estimated, for a local signal-to-noise ratio to be 1, and for transient collection to stop after roughly another 5% to 10% of the already collected transients have been obtained. The extra number of transients is needed to test the convergences, i.e. to check that the gap has stabilized and remains stable, and that the spectrum has also stabilized.

In one embodiment, the control system 150 may include a graphics system 151 that receives as input the singular values obtained by the noise reduction preprocessor 130, and generates a plot of the singular values as a function of their indices. While a logarithmic plot is described and discussed in this section, non-logarithmic plots can also be used. The control system 150 further includes a pattern recognition system 152, which is configured to identify, from the singular value plot generated by the graphics system 151, a gap between the smallest noisefree singular value and the first noise singular value. The control system 150 further includes a command signal generator 153 which is responsive to the pattern recognition system 152. The command signal generator 153 is configured to generate an output signal that requests the data acquisition system 105 to make more transient acquisitions (i.e., a "not OK" signal as illustrated in FIG. 1), if the pattern recognition system 152 fails to identify such a gap, or if the gap identified by the pattern recognition system 152 fails to converge. The command signal generator 153 is configured to generate an output signal that requests the data acquisition system 105 to stop making any further measurements (i.e., an "OK" signal as illustrated in FIG. 1), if the pattern recognition system 152 establishes the appearance and stabilization of such a gap.

The control system 150 may include a computer-readable medium that has stored therein computer-readable instructions for a processor. These instructions, when read and implemented by the processor, cause the processor to perform the steps described in paragraph 37 above, namely: 1) identify a gap between a noisefree singular value (associated with the noisefree signal subspace) and an adjacent noise singular value (associated with the noise subspace); 2) request further measurements by the data acquisition system 105 if the gap cannot be identified; 3) if the gap can be identified, determine the stability of the gap; 4) request further measurements by the data acquisition system 105, if the gap does not stabilize; and 5) request that no further measurements be made by the data acquisition system 105, if the gap has stabilized. The computer-readable medium may be any medium known in the art, including but not limited to hard disks, floppy diskettes, CD-ROMs, flash memory, and optical storage devices. The computer readable instructions discussed above may be provided through software that is distributed through the Internet.

The gap represents the numerical separation between the eigenvalues associated with the noisefree signal subspace and the eigenvalues associated with the noise subspace. Perturbation theory indicates that groups of eigenvalues that are well spaced are much less sensitive to perturbations that eigenvalues that are close together. Therefore, the well-spaced eigenvalues can be identified with the noisefree signal, and the regions of high density eigenvalues can be identified with noise. Perturbation theory also indicates that the noise subspace has less influence on the noisefree signal subspace as the gap increases in size. When changes occur or when no "gap" can be clearly estimated, then the number of transients used needs to be increased and the whole process must start again.

When it is established by the user or by the control system 150 that a clear gap has appeared and stabilized, the signal projector in the noise reduction pre-processor 130 generates a noise-reduced signal, so that a spectrum can be formed by frequency inversion. The signal projector projects the decimated measured vectors onto the noisefree signal subspace, using the following projection formula:

$$\vec{c}_n^{or} = \sum_{k=1}^{K} (\vec{u}_k^*, \vec{c}_n) \vec{u}_k \tag{4}$$

where (,) denotes the scalar, inner product of two vectors, the asterisk denotes a complex conjugate, and $u_k$ represent the eigenvectors corresponding to the singular values.

Given the decimated signal vectors $\vec{c}_n$, an estimate of the $N_d$–M+1 projected signal vectors can be made, as $\vec{X}_n \cong \vec{c}_n^{nr}$. Since a particular $X_n \cong c_n^{nr} = c_n^{NR}$ element appears in multiple vectors, an arithmetic average is taken, the result of which restores the Hankel structure of the signal matrix as defined by $X_{nm} = X_{n+m}$. As this averaging tends to cancel some of the corrections made in the projection, starting with the new signal the whole procedure is iterated to convergence several times, to give the final noise-reduced or "cleaned" signal.

The noise-reduced signal, consisting of discretized sampled points $c_n^{NR}$, is input into the spectral estimator 140, which converts the signal into frequency space by using known conversion methods such as harmonic inversion or Fourier transform, to derive a noise-reduced spectrum. Among the known methods, using harmonic inversion for the frequency conversion step gives the best results, while using the Fourier transform methods for the frequency conversion step provides improved results.

Figure 2:
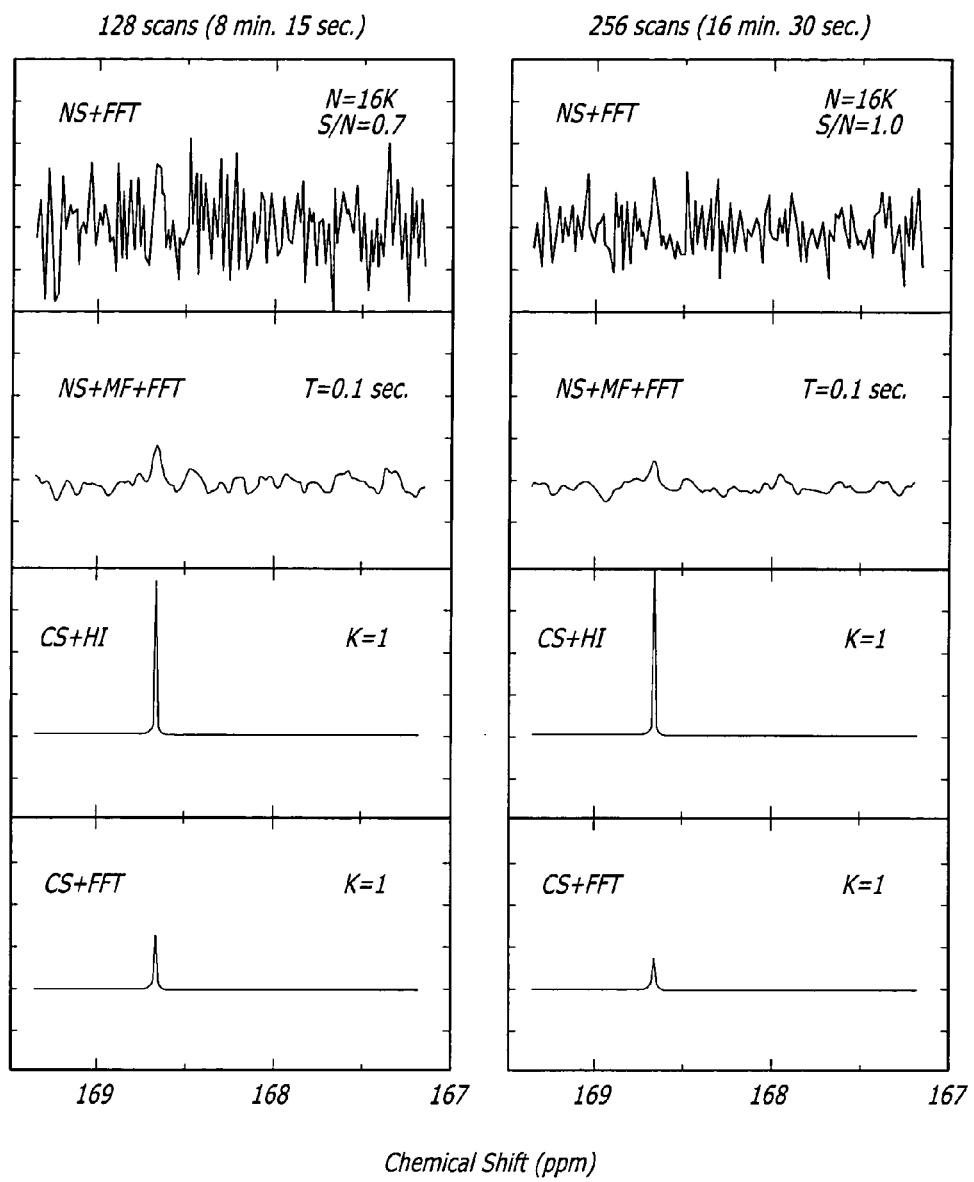
FIG. 2 illustrates the 1D $^{13}$C NMR absorption spectrum of a 15 mM solution of strychnine in $CDC_{13}$, for a carbonyl spectral region, and with signal after 128 transients (first column) and 256 transients (second column), of length N=16384.

FIG. 2 illustrates a 1D 13C NMR absorption spectrum of a 15 mM solution of strychnine in $CDC1_3$ for a carbonyl spectral region. The spectrum in FIG. 2 shows the chemically shifted singlet lines in a window. The spectral parameters were obtained with an acceptable level of accuracy on a twenty year old AM-360 MHz machine with a 5 mm diameter tube. The left column in FIG. 2 shows the results after 128 transients, with N=16384 samples, were measured and averaged. The right column shows the result after 256 transients were measured and averaged. The total acquisition time was 8 min. 15 sec., and 16 min. 30 sec., respectively. While times vary among different machines, tube size and concentration, the comparisons were made between the same machines, tubes and concentrations.

The experiment was performed with the knowledge that carbonyl was in the molecule, and that it was expected to give the lowest amplitude signal of all the carbons. The signal was expected to be in the 161 to 175 ppm region, so two windows were placed in each of 512 Fourier grid points. At 256 transients ($N_{tr}$=256) a converged result was obtained, so that any further acquisition of transients was discontinued. The second column in the figure is shown to demonstrate convergence of the processing. The legend "CS" in the figure denotes "cleaned signal," while "NS" denotes the original noisy signal. "MF" denotes the "matched filter" variant of Fourier noise reduction processing. "HI" indicates that the harmonic inversion spectral estimator was used, while "FFT" indicates that the Fast Fourier Transform spectral estimator was used. The harmonic inversion spectrum, not being on a Fourier grid, was drawn on a thousand points grid in the window of the spectrum in the figures.

Figure 3:
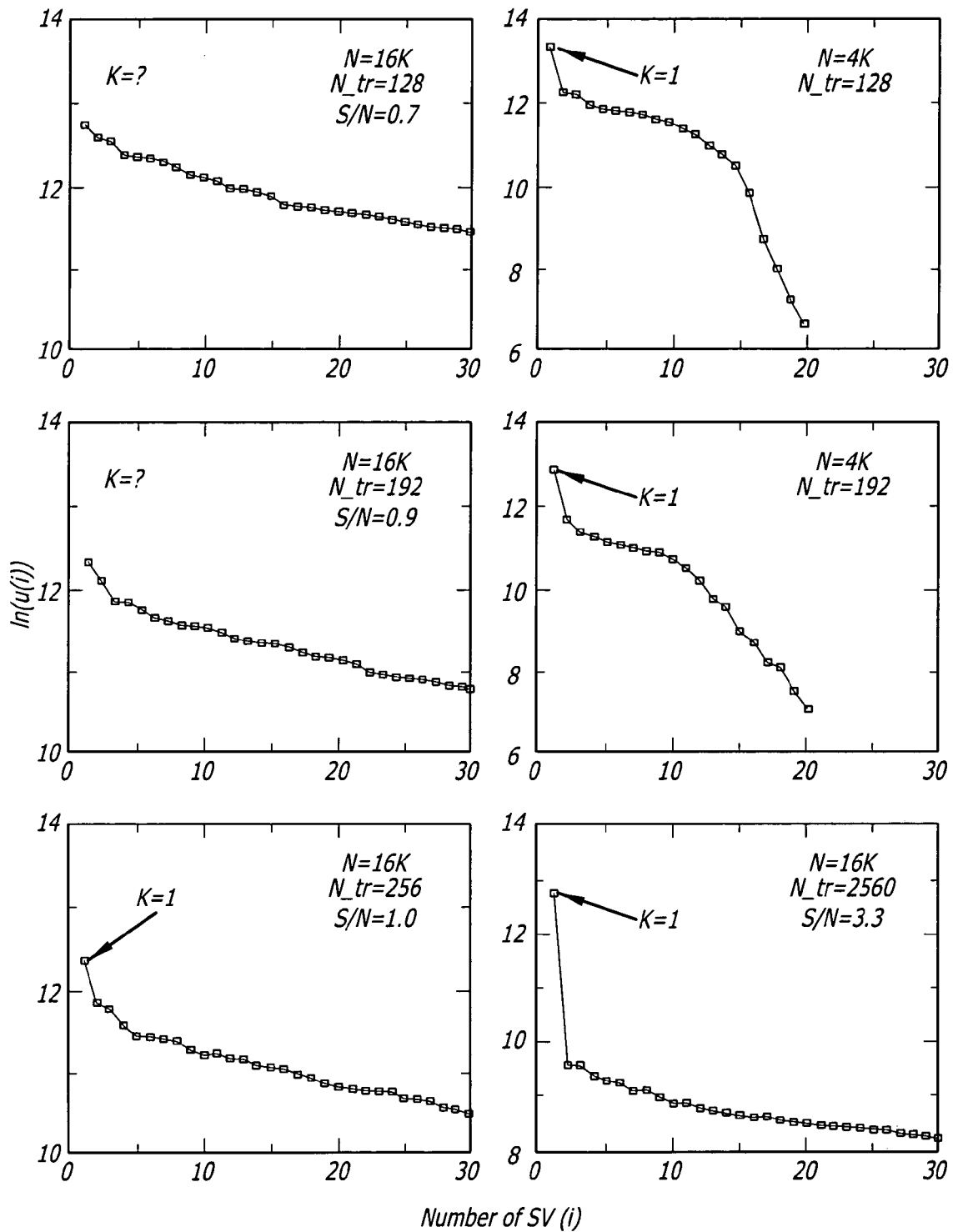
FIG. 3 illustrates the logarithmic singular value curves, calculated to obtain the 1D $^{13}$C NMR absorption spectrum of a 15 mM solution of strychnine in $CDC_{l3}$ for a carbonyl spectral region, as shown in FIG. 2.

FIG. 3 illustrates the singular value analysis for the spectrum shown in FIG. 2. The plot in FIG. 3 was generated for a noisy signal after 128 (first column) and 256 (second column) transients, respectively. The singular values are not shown for M>30. Starting with an N=16384 signal, 256 transients were needed before the singular value plot, which previously showed no gap for 128 and 192 transients, converted to a plot with a clear gap with K=1. At this point the signal-to-noise ratio was 1. A K=1 gap showed up as these signals had less noise. FIG. 3 shows that an excellent spectrum results when the full length signal for 128 and 192 transients was assumed to have K=1, and projection was done on the first eigenvector. To test the 256 transient result, which was accepted as a convergence, an experiment with 2560 transients was also done. The 2560 transient experiment, by signal averaging, has a signal-to-noise ratio that is higher by a factor of about 3. FIG. 3 shows it gave the same K=1 result and the spectrum (not shown) was the same as the $N_{tr}$=256 spectrum, except for a small line narrowing. Linewidths are always instrumental.

As seen from the FIG. 3, and most clearly from the 2560 transients experiment, the noise singular values form a quasi-horizontal string, resembling a string of pearls, to the lower right of the smallest signal point, i.e. the smallest noisefree singular value. Windowing bends the true horizontal line without prejudicing the gap. The distance from the first noise point to the smallest signal point is the gap that is being identified. The gap between the noise singular values and the noisefree singular values is clearly seen in the 256 transient and the 2560 transient results in FIG. 3. The gap appears even if the noise eigenvalues are not constant. In most case, the gap can be begun to be estimated by recognizing that it always appear at the elbow of curves, as seen from FIG. 3. The qualitative change in the eigenvalue density and spacing (low on the left and high on the right) is an indicator of a gap.

Figure 4:
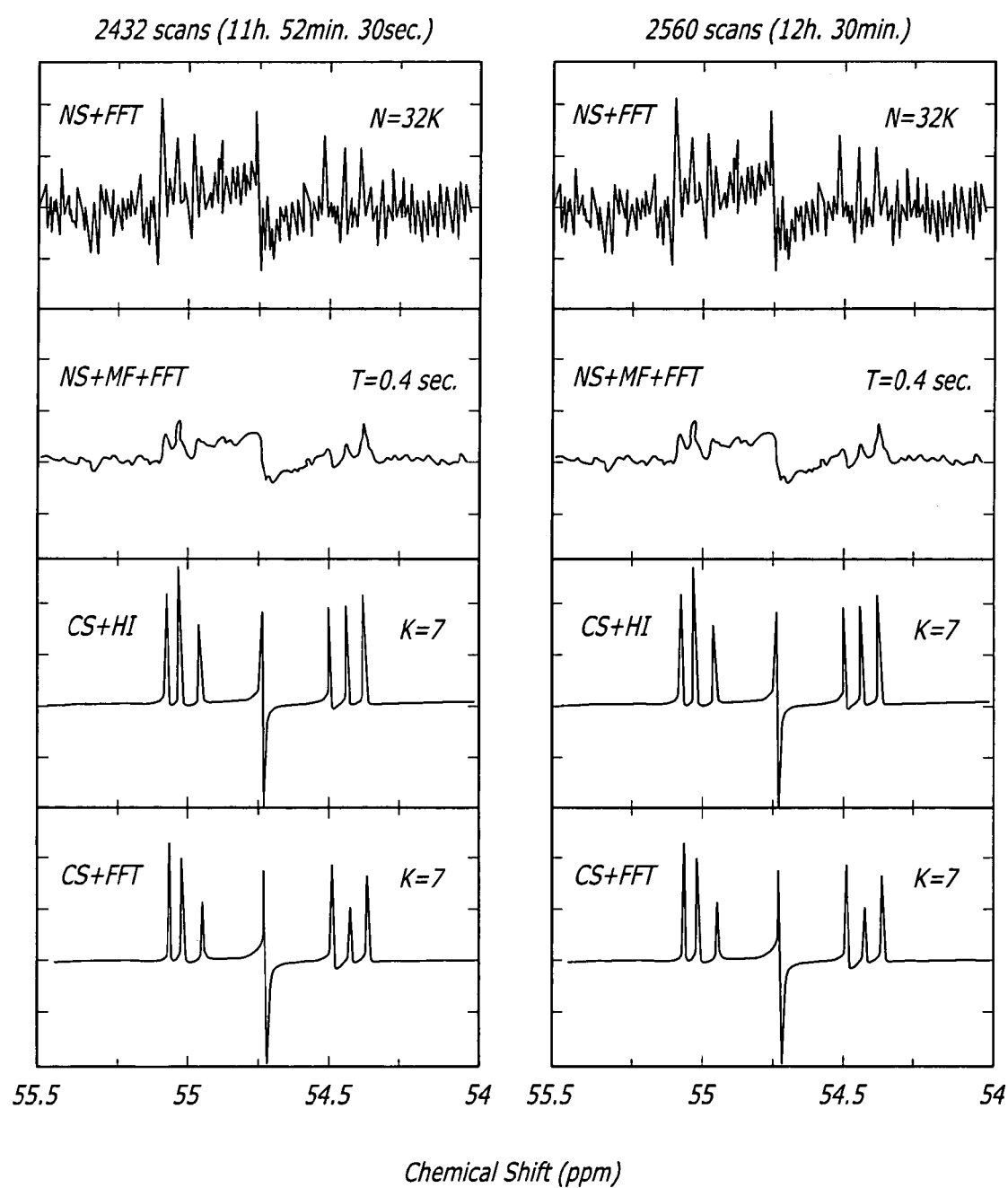
FIG. 4 illustrates a 1D INADEQUATE, spin-spin interaction $^{13}$C-$^{13}$C spectrum of a 5% solution of dicyclopentadiene in $CDCl_3$, for the 4$^{th}$ carbon spectral region for a noisy signal after 2432 and 2560 scans of length N=32K.

FIG. 4 illustrate the 1D INADEQUATE, spin-spin interaction $^{13}C$-$^{13}C$ spectrum of a 5% solution of dicyclopentadiene in $CDCl_3$ for the $4^{th}$ carbon spectral region, for a noisy signal after 2432 and 2560 scans of length N=32K. Pure signal averaging is estimated to use 2 weeks of scanning for similar results. The arrangement of plots in rows is similar to that in FIG. 2. The FID signal from the 1D INADEQUATE experiment was studied, in order to further demonstrate the ability to save transients, using the method and system described above. Windows surrounding the 4th carbon at 54.75 ppm, in a number scheme that increases with decreasing ppm, were used as an example of a typical case. The foreknowledge was the position of the singlets, and the order of magnitude of the splitting, which made the choice of windows easy. It was noted that K could be slightly more than twice the number of splittings, due to the fact that the singlet central line was not totally wiped out and in fact could appear as several lines.

To start, 2176 scans (not shown) were tried first, with and both N=16384 and 32768 for the fourth carbon. The former gave K=7, the latter K=6. For the purposes of estimating K, it was surmised that the less noisy K=7 was correct. To be certain, the number of transients $N_{tr}$ was raised to 2432 and 2560. Both cases gave a clear K=7 at both half and full lengths and a converged spectrum, as seen in FIG. 4.

Figure 5:
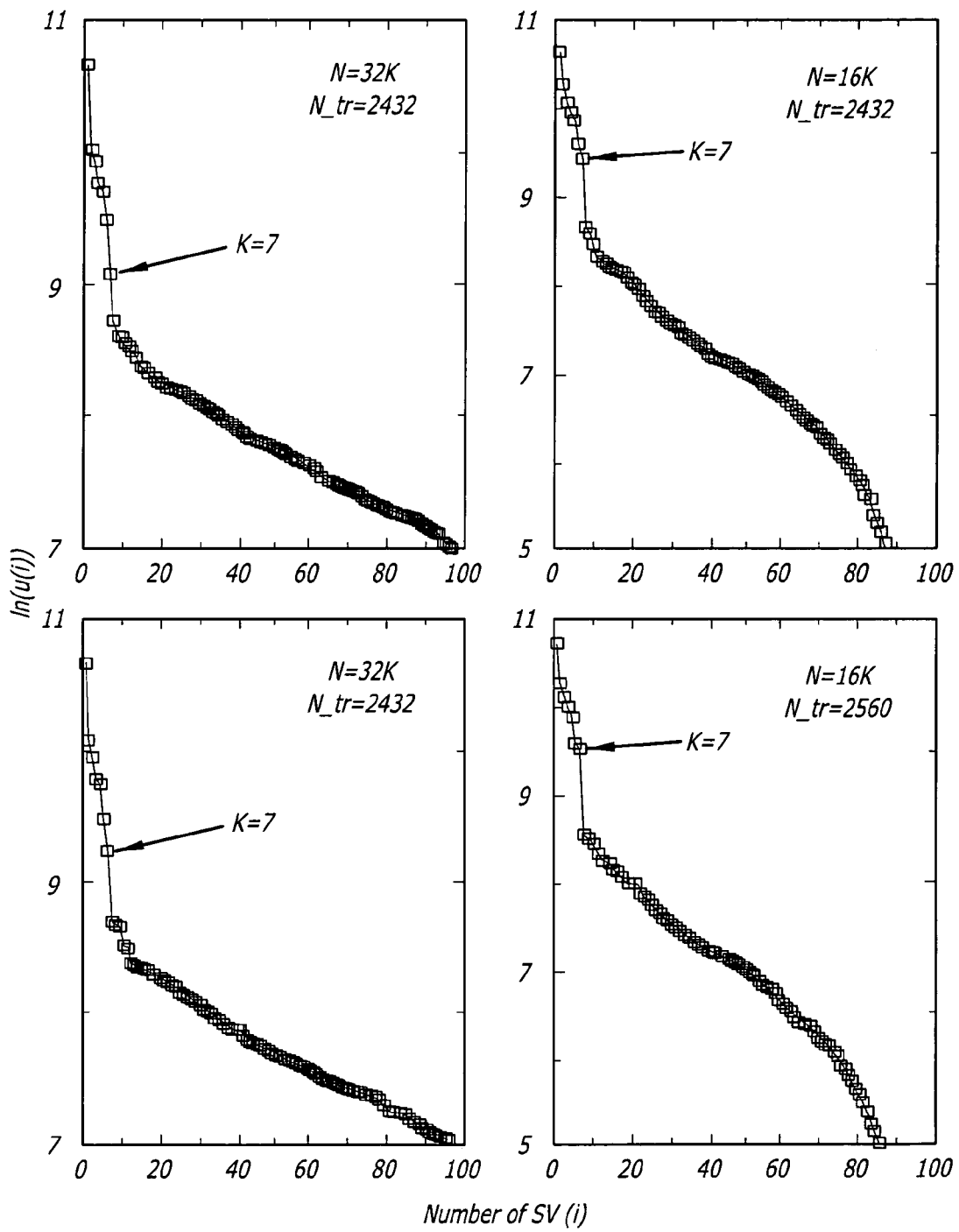
FIG. 5 illustrates the logarithmic singular value curves calculated for the experimental data presented in the left (2432 scans) and right (2560 scans) columns of FIG. 4.

FIG. 5 shows the corresponding SVD curves, for signal lengths of N=16384 and 32768, and transient numbers of 2432 and 2560, respectively. A clear gap, which is stable with respect to the increase in transients (from 2432 to 2560), can be readily discerned between the last one of the relatively well-spaced, noisefree singular values, and the first one of the closely spaced, noise singular values. The data acquisition time used was twelve hours as opposed two weeks. The data acquisition time, or machine run time, was saved by a factor of at least about 10, and up to about 100.

In sum, the technique of the present invention allows for satisfactory spectra to be generated while using substantially fewer transients than are typically acquired for NMR spectral studies, by supplying the criteria for recognizing when transient acquisitions may stop while still deriving a satisfactory spectrum from already acquired transients. The method and system of the present invention permits a spectrum (having acceptably low noise characteristics) to be generated after performing measurements that are fewer by a factor of at least about 10 and up to about 100, compared to the number of measurements required in order to generate a spectrum having a comparable signal-to-noise ratio, using signal averaging followed by fast Fourier processing. In other words, a great deal of measurement time is saved. Because machine time is generally very expensive in spectroscopic techniques such as NMR, the saving in measurement time translates into substantial cost savings.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An apparatus for performing spectral analysis of a sample, the apparatus comprising:
   a. a data acquisition system configured to measure a signal emitted from the sample in response to excitation energy applied thereto, and to average the measured signal over a plurality of measurements to generate an averaged signal for the sample;
   b. a data processing system including:
      a noise-reduction pre-processor configured to generate a noise-reduced signal from the averaged signal by creating a vector space from said averaged signal, and generating one or more singular values and corresponding eigenvectors of a correlation matrix constructed within said vector space, said vector space containing a noisefree signal subspace and a noise subspace, said singular values including noisefree singular values associated with said noisefree signal subspace, and noise singular values associated with said noise subspace; and
      a spectral estimator configured to generate a spectrum for the sample by converting said noise-reduced signal into a frequency domain; and
   c. a control system configured to identify, in a graph of the singular values of the correlation matrix constructed within the vector space created from the averaged signal, a gap between a smallest noisefree singular value and a first noise singular value, so as to request the data acquisition system to perform additional measurements of the signal emitted from the sample if no such separation gap can be identified, and to prevent further measurements of the signal emitted by the sample from being made by the data acquisition system if the gap has appeared and is stable.

2. An apparatus in accordance with claim 1, wherein said spectral analysis comprises an NMR spectral analysis, said excitation energy comprises RF excitation pulses, and said measured signal comprises an NMR transient.

3. An apparatus in accordance with claim 1, wherein said control system comprises:
   a. a graphics system adapted to generate the plot of said singular values;
   b. a pattern recognition system adapted to identify the gap in said plot between said smallest noisefree singular value and said adjacent noise singular value, and to verify the stability of said gap; and
   c. a command signal generator, responsive to said pattern recognition system, configured to generate an output signal requesting for more measurements from said data acquisition system, in the absence of an identifiable gap, and to generate an output signal requesting that further measurements be discontinued, if the appearance and the stability of said gap has been established by said pattern recognition system.

4. An apparatus in accordance with claim 1, wherein said noise-reduction preprocessor comprises:
   a. a matrix generator configured to form the vector space from the averaged signal and constructing the correlation matrix within the vector space, the vector space containing the noisefree signal subspace and the noise subspace;
   b. a matrix diagonalizer configured to diagonalize the correlation matrix to obtain its singular values and the corresponding eigenvectors, the singular values including noisefree singular values associated with the noisefree signal subspace, and noise singular values associated with the noise subspace; and
   c. a signal projector configured to project the averaged signal onto the noisefree subspace to generate a noise-reduced signal.

5. An apparatus in accordance with claim 1, wherein said data acquisition system is configured to sample each measured signal with a sampling period $\tau$, and to average the corresponding sample points over said plurality of measurements, so as to store said averaged signal as a discretized set of N data points $c_n$ (n=0, ..., N-1).

6. An apparatus in accordance with claim 5,
   wherein said data processing system is configured to store each data point $c_n$ as a noisefree component $x_n$ (n=0, ..., N-1) and a noise component $\epsilon_n$ (n=0, ..., N-1), and to store each noisefree component $x_n$ as a finite sum of damped complex harmonics weighted by respective coefficients.

7. An apparatus in accordance with claim 6,
   wherein said sum is over a number K of said damped complex harmonics, so that each noisefree component $x_n$ can be stored as:
   $$X_n = \Sigma d_k \exp(-iw_k \tau n)$$
where $d_k$ represents the weighting coefficient of the k-th damped complex harmonics, and $w_k$ represents the complex frequency of the k-th damped complex harmonics.

8. An apparatus in accordance with claim 1, wherein said data acquisition system further comprises a windowing subsystem configured to apply a windowing filter to a Fourier transform of said averaged signal, so as to generate one or more decimated signals having a limited bandwidth.

9. An apparatus in accordance with claim 8,
   wherein said data processing system is configured to store the inverse Fourier transform of each decimated signal as a set of $N_d$ decimated data points $c_n^d$ (n=0, ..., $N_d$-1), and wherein said set of decimated data points have a signal length $N_d$ that is substantially less than N and a sampling period $\tau_d$ that is substantially greater than $\tau$.

10. An apparatus in accordance with claim 9,
    wherein said vector space created by said noise-reduction pre-processor comprises an M-dimensional vector space defined by a number $N_d-M+1$ of linearly independent M-dimensional vectors, and
    wherein said data processing system is configured to store said M-dimensional vectors in a form given by:
    $$c_n^d = (c_n^d, hd\, n+1^d, \ldots, C_{n+M-1}^d),$$
    where $c_n^d$ represent said decimated data points.

11. A system in accordance with claim 10, wherein said correlation matrix constructed by said matrix generator is Hermitian and covariant, and has a dimension M×M, and wherein said correlation matrix is formed from said M-dimensional vectors and in accordance with a formula given by:
    $$R_{ij} = 1/(N_d-M+1) \Sigma c_{n+i-1} c^*_{n+j-1}.$$

12. A system in accordance with claim 10, wherein said projection of said averaged signal by said signal projector is based on a projection formula given by:

$$\vec{c}_n^{nr} = \sum_{k=1}^{K} (\vec{u}_k^*, \vec{c}_n) \vec{u}_k$$

where $u_k$ represent said eigenvectors corresponding to said singular values.

13. A control system for controlling the acquisition and processing of data from a sample by an NMR apparatus so as to reduce the NMR data acquisition time required to generate a noise-reduced NMR spectrum for the sample, said NMR apparatus comprising a data acquisition system for measuring NMR response signals from the sample and averaging said response signals over a plurality of measurements, and a data processing system for processing said NMR response signals by extracting the singular values and the corresponding eigenvectors of a harmonic inversion correlation matrix formed in a vector space defined by data points sampled from said averaged signals, said vector space containing a noisefree signal subspace and a noise subspace, said control system comprising:
   a. a first processing system for identifying, in a graph of the singular values of the harmonic inversion correlation matrix, a gap between a noisefree singular value, associated with said noisefree signal subspace, and an adjacent noise singular value, associated with said noise subspace, so that said control system can request further measurements of NMR data from the sample by said data acquisition system if said gap cannot be identified; and
   b. a second processing system for determining the stability of said gap, so that said control system can request further measurements of NMR data from the sample by said data acquisition system if said gap has not stabilized, and can discontinue any further measurements by said data acquisition system, if said gap has stabilized.

14. A control system for controlling the acquisition and processing of data from a sample by a spectral analysis apparatus so as to reduce the data acquisition time required to generate a noise-reduced spectrum for the sample, said apparatus comprising a data acquisition system for measuring response signals from the sample and averaging the response signals over a plurality of measurements, and a data processing system for processing said response signals by extracting the singular values and the corresponding eigenvectors of a harmonic inversion correlation matrix formed in a vector space defined by said averaged signals, said vector space containing a noisefree signal subspace and a noise subspace, said control system comprising:
  a. a computer-usable medium having stored therein computer-usable instructions for a processor, wherein said instructions when executed by said processor cause said processor to:
    1) identify, in a graph of the singular values of the harmonic inversion correlation matrix, a gap between a noisefree singular value, associated with said noisefree signal subspace, and an adjacent noise singular value, associated with said noise subspace;
    2) request further measurements of the response signals from the sample by said data acquisition system if said gap cannot be identified;
    3) if said gap appears, determine the stability of said gap; and
    4) request further measurements of the response signals from the sample by said data acquisition system, if said gap does not stabilize, and request that no further measurements be made by said data acquisition system, if said gap has stabilized.

15. A data processing system for processing NMR response signals measured from an NMR sample by an NMR data acquisition system, said NMR data acquisition system comprising an NMR transmitter for delivering RF excitation pulses to the NMR sample, an NMR receiver for detecting the response signals emitted by said NMR sample in response to said excitation pulses, and a measurement system for measuring said response signals and averaging said response signals over a plurality of measurements from said NMR sample, said data processing system comprising:
  a. a noise-reduction pre-processor including: 1) a matrix generator for forming a vector space from said averaged signal and constructing a correlation matrix within said vector space, said vector space containing a noisefree signal subspace and a noise subspace; 2) a matrix diagonalizer for diagonalizing said correlation matrix to obtain its singular values and the corresponding eigenvectors, said singular values including noisefree singular values associated with said noisefree signal subspace, and noise singular values associated with said noise subspace; and 3) a signal projector for projecting said averaged signal onto said noisefree subspace to generate a noise-reduced signal; and
  b. a spectral estimator for generating a spectrum by converting said noise-reduced signal into a frequency domain; and
  c. a control system configured to identify a separation between a noisefree singular value and an adjacent noise singular value, in a graph of the singular values, so as to allow the data acquisition system to perform additional measurements from said NMR sample if no such separation can be identified, and to discontinue further measurements by the data acquisition system if the appearance and stability of said separation can be established.

16. A computer-usable medium having stored therein computer-usable instructions for a processor, wherein said instructions when executed by said processor cause said processor to:
  a. input and store a signal emitted by a sample in response to excitation energy applied thereto and acquired by a data acquisition system configured to measure said signal from the sample and average said signal over a plurality of measurements from the sample;
  b. compute and store a set of singular values, said singular values corresponding to the real, non-negative eigenvalues of a correlation matrix constructed within a vector space created from said averaged signal, said vector space containing a noisefree signal subspace and a noise subspace, said singular values including noisefree singular values associated with said noisefree signal subspace, and noise singular values associated with said noise subspace;
  c. determine whether a gap appears between a noisefree singular value and an adjacent noise singular value in a plot of said singular values, and if so, whether said gap stabilizes over one or more additional measurements of said signal from said sample;
  d. request further measurements by said data acquisition system, if said gap cannot be identified or if said gap does not stabilize; and
  e. command the data acquisition system to discontinue any further measurements, if the appearance and stability of said gap can be established.

17. A computer-usable medium having stored therein computer-usable instructions for a processor, wherein said instructions when executed by said processor cause said processor to:
  a. average over a number of data measurements from a sample to generate an averaged signal representing the data from the sample;
  b. construct a correlation matrix from said averaged signal in a vector space defined using said averaged signal, said vector space including a noisefree signal subspace and a noise subspace;
  c. diagonalize said correlation matrix to obtain the singular values and their corresponding eigenvectors, said singular values including noisefree singular values derived from said noisefree signal subspace, and noise singular values derived from said noise subspace; and
  d. generate a graph of the singular values, and determine when a gap between a noisefree singular value and a noise singular appears in the graph and stabilizes, in order to establish that a sufficient number of data measurements have been performed for the sample so that measurements from the sample can discontinue.

18. A computer-usable medium having stored therein computer-usable instructions for a processor, wherein said instructions when executed by said processor cause said processor to:
  a. measure one or more response signals emitted by a sample in response to excitation applied thereto;
  b. average corresponding sample points in a plurality of signal measurements to generate a plurality of signal averaged sample points;
  c. use said signal averaged sample points to form a vector space that comprises a noisefree signal subspace and a noise subspace;
  d. construct a correlation matrix within said vector space and diagonalize said correlation matrix to obtain the singular values and their corresponding eigenvectors, said singular values including noisefree singular values associated with said noisefree signal subspace, and noise singular values associated with said noise subspace;

e. generate a graph of the singular values, and determine when a gap appears between a smallest one of said noisefree singular values and a first one of said noise singular values, in a plot of said singular values, and whether said gap remains substantially stable after a plurality of iterations of steps a to d, to establish that a sufficient number of measurements has been reached for generating a substantially stable spectrum.

19. A computer-usable medium having stored therein computer-usable instructions for a processor, wherein said instructions when executed by said processor cause said processor to:

a. receive a set of singular values from a data acquisition system, said singular values representing the eigenvalue solutions of a correlation matrix constructed from a vector space creating using one or more response signals from a sample that have been averaged over a plurality of measurements for the sample, said vector space containing a noisefree signal subspace and a noise subspace, said singular values including noisefree singular values associated with said noisefree signal subspace and a noise subspace associated with said noise subspace;

b. generate a graph of the set of singular values, and determine whether a gap appears between a noisefree singular value and an adjacent noise singular value in a plot of said singular values, and if so, whether said gap stabilizes over one or more additional measurements of said signal;

c. request further measurements by said data acquisition system, if said gap cannot be identified or if said gap does not stabilize; and d. command said data acquisition system to discontinue any further measurements, if the appearance and stability of said gap can be established.

20. A computer-usable medium having stored therein computer-usable instructions for a processor, wherein said instructions when executed by said processor cause said processor to:

a) apply one or more excitation pulses to a sample and measuring a response signal therefrom;

b) repeat step a) a plurality of times, and store for each of said repetitions an acquired transient;

c) sample each transient and average over all of said sampled transients to generate a collection of data points $c_n$ (n =1, . . . , N);

d) form an M-dimensional vector space using said sampled data points $c_n$ (n =1, . . . , N), said M-dimensional vector space comprising a noisefree signal subspace and a noise subspace;

e) construct an M×M correlation matrix within said M-dimensional vector space, and diagonalize said correlation matrix so as to extract therefrom a set of singular values $u_i (i=1, \ldots, M)$;

f) generate a plot of said singular values $u_i$ in M-space, said plot showing both noisefree singular values and noise singular values, wherein said noisefree singular values are associated with said noisefree signal subspace, and said noise singular values are associated with said noise subspace, g) determine whether a gap appears between a smallest one of plotted noisefree singular values and the first one of said plotted noise singular values;

h) if said gap does not appear, repeating steps a to g one or more times until said gap can be identified;

i) determine whether said gap remains stable after a plurality of iterations of steps a to g; and j) upon stabilization of said gap, convert said sampled data points into a frequency domain so as to generate a noise-reduced spectrum.

* * * * *